(12) United States Patent
Celler

(10) Patent No.: US 8,299,485 B2
(45) Date of Patent: Oct. 30, 2012

(54) SUBSTRATES FOR MONOLITHIC OPTICAL CIRCUITS AND ELECTRONIC CIRCUITS

(75) Inventor: George K. Celler, Summit, NJ (US)

(73) Assignee: Soitec, Bernin (FR)

( * ) Notice: Subject to any disclaimer, the term of this patent is extended or adjusted under 35 U.S.C. 154(b) by 127 days.

(21) Appl. No.: 12/810,133

(22) PCT Filed: Mar. 19, 2008

(86) PCT No.: PCT/IB2008/002156
§ 371 (c)(1),
(2), (4) Date: Jul. 6, 2010

(87) PCT Pub. No.: WO2009/115859
PCT Pub. Date: Sep. 24, 2009

(65) Prior Publication Data
US 2010/0295083 A1 Nov. 25, 2010

(51) Int. Cl.
*H01L 33/00* (2010.01)
*G02B 6/12* (2006.01)
(52) U.S. Cl. .............. 257/98; 257/E31.127; 385/14
(58) Field of Classification Search .......... 257/98, 257/E31.127; 385/14
See application file for complete search history.

(56) References Cited

U.S. PATENT DOCUMENTS

| | | | |
|---|---|---|---|
| 7,110,629 B2 * | 9/2006 | Bjorkman et al. ............. 385/14 |
| 7,229,898 B2 | 6/2007 | Bourdelle et al. ............ 438/455 |
| 7,232,743 B2 | 6/2007 | Aulnette et al. .............. 438/478 |
| 7,256,075 B2 | 8/2007 | Ghyselen et al. ............. 438/149 |
| 7,262,117 B1 | 8/2007 | Gunn, III et al. ............. 438/481 |
| 7,282,449 B2 | 10/2007 | Daval et al. .................... 438/689 |
| 7,285,471 B2 | 10/2007 | Maleville et al. ............. 438/311 |
| 2004/0207016 A1 | 10/2004 | Patel et al. ..................... 257/347 |
| 2004/0266145 A1 | 12/2004 | Morse .......................... 438/481 |
| 2005/0136566 A1 | 6/2005 | Morse ............................ 438/63 |
| 2005/0136626 A1 | 6/2005 | Morse ............................ 438/481 |
| 2007/0181977 A1 | 8/2007 | Lochtefeld et al. .......... 257/618 |
| 2008/0002929 A1 * | 1/2008 | Bowers et al. .................. 385/15 |
| 2008/0153267 A1 | 6/2008 | Clavelier et al. ............. 438/481 |
| 2008/0181977 A1 | 7/2008 | Sperry et al. .................... 425/90 |

FOREIGN PATENT DOCUMENTS

EP 1 936 669 6/2008
(Continued)

OTHER PUBLICATIONS

D. D. Cannon et al., "Germanium-Rich Silicon-Germanium Films Epitaxially Grown by Ultrahigh Vacuum Chemical-Vapor Deposition Directly on Silicon Substrates", Applied Physics Letters, vol. 91, pp. 252111-1-252111-3 (2007).

(Continued)

*Primary Examiner* — William D Coleman
(74) *Attorney, Agent, or Firm* — Winston & Strawn LLP

(57) ABSTRACT

A multilayer wafer structure containing a silicon layer that contains at least one waveguide, an insulating layer and a layer that is lattice compatible with Group III-V compounds, with the lattice compatible layer in contact with one face of the insulating layer, and the face of the insulating layer opposite the lattice compatible layer is in contact with the silicon layer. The silicon and insulating layers contain either or both of at least one continuous cavity filled with materials such as to constitute a photodetector zone, or at least one continuous cavity filled with materials such as to constitute a light source zone.

10 Claims, 7 Drawing Sheets

FOREIGN PATENT DOCUMENTS

| WO | WO 02/13342 | 2/2002 |
|---|---|---|
| WO | WO 2007/053686 | 5/2007 |
| WO | WO 2008/099246 | 8/2008 |

OTHER PUBLICATIONS

A.W. Fang et al., "Integrated AlGaInAs-Silicon Evanescent Racetrack Laser and Photodetector," Optics Express, vol. 15, No. 5, pp. 2315-2322 (2007).

R. L. Espinola et al., Raman Amplification in Ultrasmall Silicon-On-Insulator Wire Waveguides, Optics Express, vol. 12, No. 16, pp. 3713-3718 (2004).

J. M. Hartman et al.,"Reduced Pressure-Chemical Vapor Deposition of Ge Thick Layers on Si(001) for *1.3-1.55-μm* Photodetection", Journal of Applied Physics, vol. 95, No. 10, pp. 5905-5913 (2004).

Ji-Soo Park et al., "Reduced-Pressure Chemical Vapor Deposition of Epitaxial Ge Films on Si(001) Substrates Using $GeCl_4$", Electrochemical and Solid-State Letters, vol. 10 (11), pp. H313-H316 (2007).

L. C. Kimerling et al., "Electronic-Photonic Integrated Circuits on the CMOS Platform", Proc. of SPIE, vol. 6125, pp. 612502-1-612502-10 (2006).

D.-X. Xu et al., "Silicon-On-Insulator (SOI) as a Photonics Platform", 207th ECS Meeting, Abstract #554, copyright ECS, Institute for Microstructural Sciences, National Research Council Canada, Ottawa, Ontario K1A 0R6, Canada, (2005).

International Search Report, PCT/IB2008/002156, mailed Dec. 23, 2008.

D. D. Cannon et al., "Germanium-Rich Silicon-Germanium Films Epitaxially Grown by UltrahighVacuum Chemical-Vapor Deposition Directlyon Silicon Substrates", Applied Physics Letters, vol. 91, pp. 252111-252111-3 (2007).

R. L. Espinola et al., Raman Amplification in Ultrasmall Silicon-On-Insulator Wire Waveguides, Optics Express, vol. 16, No. 16, pp. 2713-3718 (2004).

J. M. Hartman et al.,"Reduced Pressure-Chemical Vapor Deposition of Ge Thick Layers on Si(001) for *1.3-1.55-μm* Photodetection", Journalof Applied Physics, vol. 95, No. 10, pp. 5905-59013 (2004).

Ji-Soo Park et al., "Reduced-Pressure Chemical Vapor Deposition of Epitaxial Ge Films on Si(001) Substrates Using GeCl4", Electrochemical and Solid-State Letters, vol. 10 (11), pp. H313-H316 (2007).

L.C. Kimerling et al., "Electronic-Photonic Integrated Circuits on the CMOS Platform", Proc. of SPIE, vol. 6125, pp. 612502-1-612502-10 (2006).

\* cited by examiner

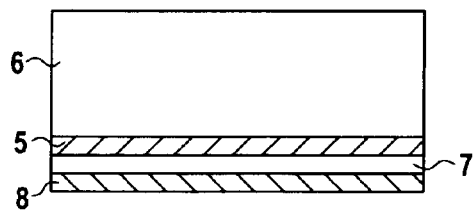
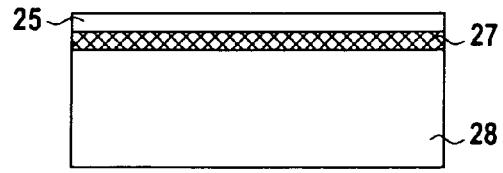
FIG.3A  FIG.3B
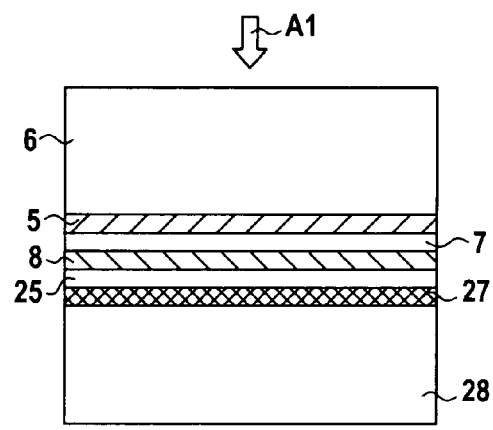
FIG.3C
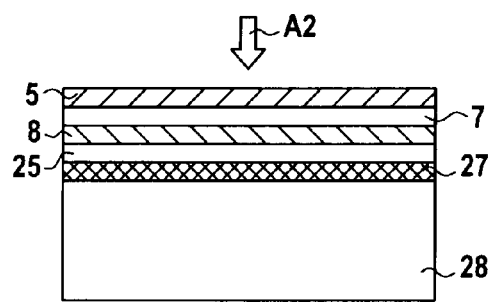
FIG.3D
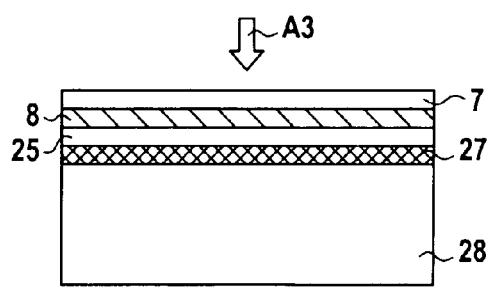
FIG.3E

SUBSTRATES FOR MONOLITHIC OPTICAL CIRCUITS AND ELECTRONIC CIRCUITS This application is a 371 filing of International Patent Application PCT/IB2008/002156 filed Mar. 19, 2008.

TECHNICAL FIELD

The present invention relates to a multilayer wafer structure comprising both electronic components such as MOS circuits and fully integrated optical circuits such as integrated photonic circuits. The present invention also relates to a method for manufacturing such multilayer wafer structures.

BACKGROUND ART

In order to obtain maximum speed in signal transmission on a wafer surface, it would be of interest to be able to use light to transmit signals over a given wafer, since light transmission is faster than transmission purely by way of an electric circuit, the difference being several orders of magnitude. As it was pointed out in the International Technology Roadmap for Semiconductors (ITRS), Interconnect Chapter (Semiconductor Industry Association, 2005, available at http://www.itrs.net), the RC (resistance times capacitance) delay time constant has become much larger than the transistor delay, thus dominating the circuit performance. In spite of the use of copper and low-k dielectric, the shrinking cross-section of the metal interconnects and their ever closer spacing on the chip significantly slow down signal propagation through the circuit. In the example given in the ITRS Interconnect chapter, 250 psec for 1 mm of a copper line could be compared to less than 10 psec for a signal transmitted optically. Another, even more important factor is that the bandwidth (i.e. the amount of information) that can be carried by an optical signal is usually much greater than what is possible with an electrical signal. And since optical fiber communication already dominates in telecom applications and is spreading to shorter distance links, such as between computers in a single building, it is important to build integrated optical circuits in which light signals are launched and processed before entering an optical fiber, or conversely light signals are received from an optical fiber, processed, and converted to electrical signals. An opto-electronic module, in which one part processes light before it is sent out and another part processes light received from outside is called a transceiver, as it has a transmitter and a receiver.

Optical circuits based on silicon-on-insulator (SOI) wafers exist, but light sources are external, not comprised within the SOI wafer. Individual components of optical circuits in silicon wafers, typically by taking advantage of SOI structures, have been demonstrated (Intel modulator, Luxtera transceiver, Ge photodetectors by selective epi on Si, SOI waveguides). In all these examples the light sources are external to the SOI wafer, either coupled by optical fibers or attached to the wafer surface. In one recent publication (A. Fang, R. Jones, H. Park, O. Cohen, O. Raday, M. Paniccia, and J. Bowers, "Integrated AlGaInAs-silicon evanescent race track laser and photodetector," Opt. Express 15, 2315-2322 (2007), the laser sources are hybrid structures, with AlGaInAs light emitters coupled by bonding to SOI surface so that the laser cavity is partially in AlGaInAs and partially in Si below it.

SUMMARY OF THE INVENTION

The present invention proposes to use germanium, or another lattice material compatible with III-V compounds, or a suitable III-V compound, as a template for growth of, on the one hand, further germanium or a compound of Group III and Group V (a III-V material) which can contain a photodetector, and, on the Other hand, a III-V material which can contain a light source. By this means, light source and photodetector regions can be made to coexist in the surface regions of a single wafer, the surface silicon layer of the wafer containing a waveguide, enabling propagation of light from the light source to the detector region. The waveguide, typically made of silicon, confines and directs the emitted light through any required optical components (modulators, ring resonator delay lines, Mach-Zender interferometers, multiplexers, demultiplexers, etc.) and to a detector.

Depending on application, light may be sent from a light source to a detector on the same chip, or in a transceiver configuration the source is connected through a series of devices, such as modulators, multiplexers, etc. (the transmitter part of the transceiver) with waveguides to an external fiber and sent out of the chip, while in another part of the chip light from an external fiber is coupled in, demultiplexed (if many signals are sent in on slightly different wavelengths of light), and sent to detectors (the receiver section). The whole transceiver or at least a majority of components is included within the engineered substrate. It is also possible to have separate transmitter chip and a receiver chip, instead of having both functions combined in a transceiver.

The waveguide comprises a core region of a transparent material with a refractive index N1, surrounded by a material of a lower refractive index N2. Light that is not far from parallel to the boundary between the two materials is trapped inside the N1 material because of total internal reflection. Optical glass fibers consist of a core with higher index N1 and cladding with a lower index N2. It is possible to make planar waveguides from a glass or silica ($SiO_2$) deposited on silicon. Some regions may be doped with impurities such as boron and will thus have a slightly higher index than the "cladding". For silicon waveguides with $SiO_2$ cladding, the difference between N1 and N2 is very large—approximately 3.5 versus 1.46, and this makes possible very sharp bends in the waveguide so that the whole optical circuit can be made in a small area, for example the size of a silicon CMOS chip. The waveguide is a narrow and long strip of silicon defined by lithography and etching, and it is usually surrounded by $SiO_2$. There are two types of silicon waveguides, often called wire (or strip) waveguides and rib (or ridge) waveguides, as shown in FIGS. 6A and 6B, respectively. In these Figures, regions (91) and (93) are typically $SiO_2$-based, and regions (97) and (98) are typically Si-based.

A wire waveguide has a rectangular cross-section and is surrounded by material of a lower refractive index, typically $SiO_2$. The cross-section can be as small as 450 nm wide by 220 nm thick [example from Richard L. Espinola, Jerry I. Dadap, Richard M. Osgood, Jr., Sharee J. McNab and Yurii A. Vlasov, "Raman amplification in ultrasmall silicon-on-insulator wire waveguides," Opt. Express 12, 3713-3718 (2004)]. Often the cross section is larger, up to 1000 nm in width and 500 nm in thickness. (a description of waveguides and other optical components in SOI can be found for example in [D.-X. Xu, A. Delage, P. Cheben, B. Lamontagne, S. Janz, W. N. Ye, "Silicon-on-Insulator (SOI) as a Photonics Platform", in *Silicon-on-Insulator Technology and Devices XII*, ECS Proc Vol. 2005-03, edited by G. K. Celler et al. (The Electrochemical Society, Pennington, N.J., USA, 2005)]). A rib waveguide is a region of silicon that is thicker than the surrounding area (see FIG. 6B). The cross-section of a rib waveguide has similar dimensions to that of the wire waveguide. Although the rib waveguide is a part of a larger sheet of silicon, the photons are primarily confined in the rib region. Silicon is opaque to the visible light, but it is transparent (low absorption) in the wavelength regions that are used in telecom applications: near 1.3 micrometer, and even better near 1.55 micrometer. Single crystalline Si such as used in SOI, is more transparent than polycrystalline Si that could be simply deposited on an oxidized Si wafer. There are two reasons for this, 1) grain boundaries scatter some light from its main path, and 2) when waveguides are etched out of silicon film, the sidewalls etched in polycrystalline material are rougher, which again causes light losses by scattering. In actual measurements, the attenuation of light intensity was about 0.35 dB/cm in an SOI waveguide as compared to 4 dB/cm in a polycrystalline silicon waveguide. [L. C. Kimerling et al., "Electronic-photonic integrated circuits on the CMOS platform", Proceedings of SPIE, Photonics West, 2006]. In other words, in the SOI waveguide light will lose half of its intensity after travelling a distance of about 8.5 cm, whereas in a polycrystalline system the same will happen after only 0.75 cm.

In the present invention, therefore, the waveguide preferably comprises a core region of silicon, and a cladding of silicon dioxide. Alternatives to silicon dioxide for the cladding include deposited silicon oxide, where the ratio of Si to O is not stoichiometric like in $SiO_2$, silicon nitride, a multilayer structure of silicon oxide and silicon nitride, aluminium oxide $Al_2O_3$, diamond, or silicon carbide. It may be noted here that "cladding" usually means that the cladding material surrounds the waveguide on all sides. In the some embodiments of the present invention, there is a buried oxide (BOX) layer below (see layer (27) in any of FIG. 4 or 7), and another buried oxide (BOX) layer on the sides and top (see layer (8) in any of FIG. 4 or 7). Most often the bottom layer is thermally grown silicon dioxide and the top and sides can comprise deposited or thermal silicon dioxide as well. But it is conceivable that the bottom layer may not the same material as the rest of the cladding.

Thus, in one aspect of the present invention, a multilayer wafer structure is provided containing a layer (25) that is lattice compatible with III-V compounds, said layer (25) being in contact with one face of an insulating layer (8), wherein the face of the insulating layer (8) opposite to said layer (25) is in contact with a silicon layer (7), wherein:
  said silicon layer (7) and said insulating layer (8) contain at least one continuous cavity linking the underlying layer (25) to the exposed surface (71) of the wafer structure and the said cavity is filled with materials compatible for fabricating a light detector and a photodetector region is formed therein, thus constituting a photodetector zone (61); and/or
  said silicon layer (7) and said insulating layer (8) contain at least one other continuous cavity linking the underlying layer (25) to said exposed surface (71) of the wafer structure and the said cavity is filled with a III-V material and a light source region is formed therein, thus constituting a light source zone (62); and
  wherein said silicon layer (7) contains at least one waveguide connecting said photodetector zone (61) with a light source that is either within the multilayer wafer structure or is connected to it by an optical fiber, and/or said silicon layer contains at least one waveguide connecting said light source zone (62) with a photodector that is either within the multilayer wafer structure or is outside it and connected to it by an optical fiber.

It may be noted in this context that there no absolute need to connect and maintain a connection between the layer (25) and the surface (71). In a preferred embodiment the layer (25) is germanium, but it could also be a silicon-germanium alloy, an alloy consisting of III-V compounds, or in some cases a structure made of silicon. Preferably, the materials compatible for fabricating a light detector in zone (61) in which a photodetector region is formed, comprise germanium or a III-V compound, or a mixture of these, including a mixture in the form of a multilayer structure. III-V materials in the present invention are preferably selected from the group consisting of: GaAs, InP, GaN, InGaAsP, InGaAs, AlGaAs.

In a preferred embodiment of the present invention, the silicon layer (7) contains at least one waveguide connecting said photodetector region and said light source region, both photodetector zone (61) and said light source zone (62) being contained within the same multilayer wafer structure.

However, it is also possible to use the multilayer wafer structure of the invention, with an upper silicon layer (7) that contains a waveguide, in systems where the waveguide links a photodetector or light source region, one of which is not within the multilayer wafer structure.

Thus, in one aspect, the present invention relates to a multilayer wafer structure wherein said silicon layer (7) contains a waveguide connecting said light source region with a photodetector that is outside the said multilayer wafer structure and connected to it by an optical fiber. Similarly, in another aspect, present invention relates to a multilayer wafer structure wherein said silicon layer (7) contains a waveguide connecting said photodetector region with a light source that is outside the said multilayer wafer structure and connected to it by an optical fiber.

As a preferred choice of insulating layer (8) in contact with the layer (25) that is lattice compatible with III-V compounds, in a multilayer wafer structure of the invention, insulating layer (8) may appropriately contain silicon dioxide.

In appropriate embodiments according to the present invention, the layer (25) that is lattice compatible with III-V compounds, comprises Ge, InP, GaAs or GaN, their alloys, and most typically Ge.

The multilayer wafer structure according to the present invention may show the layer (25) supported on an oxide layer (27), itself supported by a silicon base substrate (28) so as to constitute a Si-BOX-Ge-BOX-Si pentalayer structure. This structure is accessible by current wafer fabrication techniques, but it is expected that other structures according to the present invention will function. In particular, the oxide layer (27) is there mainly to help in wafer fabrication, but it is expected that devices could work without it. For example, it is possible to prepare a layer (25) that is lattice compatible with III-V compounds, for example Ge, directly on a support surface, which may be a silicon support or other support.

FIG. 7B shows a schematic representation of such a multilayer wafer structure according to the invention, with, in ascending order, a base support (128), a layer (25) that is lattice compatible with III-V compounds, an insulating layer (8), and a silicon layer (7) containing at least one waveguide, wherein:
  said silicon layer (7) and said insulating layer (8) contain at least one continuous cavity linking the underlying layer (25) to the exposed surface (71) of the wafer structure and the said cavity is filled with materials compatible for fabricating a light detector and a photodetector region is formed therein, thus constituting a photodetector zone (61); and
  said silicon layer (7) and said insulating layer (8) contain at least one other continuous cavity linking the underlying germanium layer (25) to said exposed surface (71) of the wafer structure and the said cavity is filled with a III-V material and a light source region is formed therein, thus constituting a light source zone (62).

In this schematic representation, both photodetector zone (61) and light source zone (62) are within the same multilayer wafer structure. However, as mentioned above, embodiments can be envisaged in which the silicon layer (7) contains at least one waveguide connecting the photodetector zone (61) with a light source that is outside the multilayer wafer structure but connected to it by an optical fiber, and alternatively the silicon layer (7) could contain at least one waveguide connecting a light source zone (62) within the silicon layer (7) with a photodector that is outside the multilayer wafer structure but connected to it by an optical fiber.

In another aspect, the present invention further relates to a method of manufacturing a multilayer wafer structure (108, 208) comprising the steps of:

(a) providing a multilayer wafer structure (200) containing a layer (25) that is lattice compatible with III-V compounds, said layer (25) being in contact with one face of an insulating layer (8), wherein the face of the insulating layer (8) opposite to said layer (25) is in contact with a silicon layer (7) that contains at least one waveguide;

(b) coating silicon layer (7) with a protective sacrificial and masking layer (81);

(c) carrying out lithography and etching to produce a first cavity (41) extending from said underlying layer (25) through said insulating layer (8), said silicon layer (7) and said protective sacrificial and masking layer (81) to the exposed upper surface (171, 271);

(d) filling in said cavity (41) with materials compatible for fabricating a light detector and forming a photodetector region therein, thus constituting a photodetector zone (61);

(e) removing excess material from the surface used for filling said cavity (41), as well as residual protective sacrificial and masking layer deposited in step (b);

(f) coating silicon layer (7) once more with a protective sacrificial and masking layer (81);

(g) carrying out lithography and etching to produce a second cavity (42) extending from said underlying layer (25) through said insulating layer (8), said silicon layer (7) and said protective sacrificial and masking layer (81) to the exposed upper surface (171, 271);

(h) filling in said cavity (42) with materials with a III-V material and forming a light source region therein, thus constituting a light source zone (62);

(i) removing excess material from the surface used for filling said cavity (42), as well as residual protective sacrificial and masking layer deposited in steps (b) and/or (f).

In a preferred embodiment of the above manufacturing method of the invention, the product obtained from step (i) is further subjected to coating with silicon dioxide of the functional silicon layer (7) containing a waveguide.

In a further preferred embodiment of the above manufacturing method of the invention, the multilayer wafer structure (200) contains a Si-BOX-Ge-BOX-Si pentalayer structure comprising a central germanium layer (25) sandwiched between two silicon dioxide layers (8) and (27), the silicon dioxide layer (8) being sandwiched between germanium layer (25) and a surface silicon layer (7) and the silicon dioxide layer (27) being sandwiched between germanium layer (25) and a support silicon layer (28). Appropriately, the Si-BOX-Ge-BOX-Si pentalayer structure is provided by the following process:

a) providing a silicon-on-insulator (SOI) structure comprising a surface silicon dioxide layer (8) and an inner silicon dioxide layer (5), between which is sandwiched a silicon layer (7), the face of the silicon dioxide layer (5) opposite the silicon layer (7) being a silicon support layer (6);

b) providing a germanium-on-insulator structure (GeOI) comprising a silicon dioxide layer (27) sandwiched between a silicon support layer (28) and a germanium layer (25);

c) bonding the silicon dioxide layer (8) of the said SOI structure to the germanium layer (25) of the said GeOI structure to form an assembled SOI-GeOI structure;

d) removing the silicon support layer (6) from the said assembled SOI-GeOI structure; and e) removing the silicon dioxide layer (5) from the assembled SOI-GeOI structure.

BRIEF DESCRIPTION OF THE FIGURES

The attached Figures show schematic representations of some preferred embodiments according to the present invention. It is to be noted that the Figures are for illustrative purposes only, and variants are possible without departing from the spirit and scope of the invention as defined by the appended claims. The continual development of semiconductor manufacturing technology means that a variety of methods are already available or becoming increasing available for preparing multilayer wafer structures according to the invention comprising a functional upper silicon layer (7), in which optical waveguides are made, is separated from a lower layer (25), typically comprising Ge or III-V, by an insulating layer (8).

FIG. 3 shows in a schematic and illustrative manner a method assembly of SOI and GeOI structures as prepared in the process embodiments shown in FIGS. 1 and 2, followed by removal of the residue of the handle substrate used to produce the SOI structure, producing a pentalayer Si/BOX/Ge/BOX/Si structure.

FIG. 7A illustrates schematically a multilayer wafer structure, prior to the preparation of photodetector zone (61) and light source zone (62), on a generalized support layer (128).

FIG. 7B illustrates schematically a multilayer wafer structure according to the present invention on a generalized support layer (128) after the incorporation of said zones to which is attached an optical fiber (63).

DETAILED DESCRIPTION OF THE INVENTION

Figure 1A:
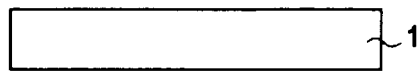
FIG. 1 shows in a schematic and illustrative manner one possible manufacturing stage in the preparation of a multilayer structure according to the present invention, this manufacturing stage consisting in the preparation of a surface-oxidized SOI (silicon-on-insulator) substrate using Smart Cut® technology.
Figure 1B:
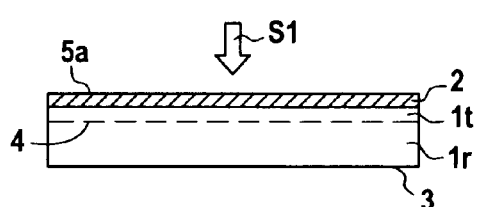
Figure 1C:
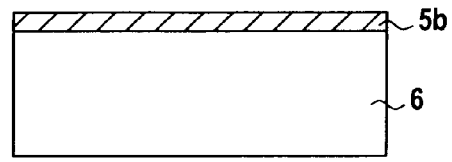
Figure 1D:
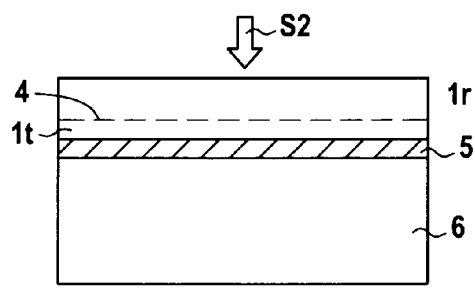
Figure 1E:
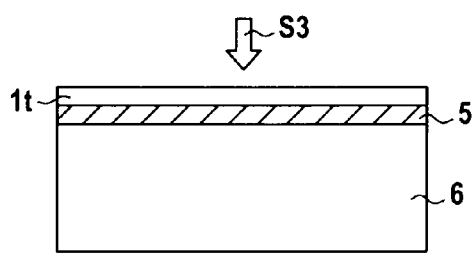
Figure 1F:
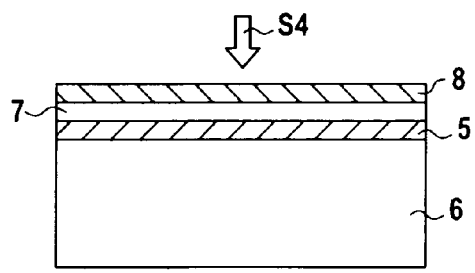

A method of manufacturing, according to one embodiment of the present invention, a multilayer structure according to the present invention will now be described with reference to FIGS. 1 to 4. This embodiment is merely illustrative, it being possible to envisage various means of obtaining multilayer wafer structures according to the invention.

In this embodiment, the manufacturing process comprises a series of distinct phases that may be separated into: 1) preparation of an SOI (silicon-on-insulator) substrate with an oxidized (silicon dioxide) surface layer; 2) preparation of a GeOI (germanium-on-insulator) substrate; 3) assembly of the SOI and GeOI structures, followed by removal of the residue of the handle substrate used to produce the SOI structure, producing a pentalayer Si/BOX/Ge/BOX/Si structure; 4) removal of the outer Si and BOX (meaning "Buried Oxide") layers in selected regions to expose Ge, and growth of at least one Ge photodetector on at least one thus exposed Ge site and growth of at least one photoemitting structure made of III-V material on at least one other thus exposed Ge site.

The first phase of this process, which need not precede in time the second phase, is represented schematically by FIG. 1. The first phase presented here comprises known technology (Smart Cut®) for preparing a standard SOI wafer with Si thickness in the 200 nm to 1.5 micron range for bonding to the GeOI wafer whose preparation will be described in phase 2. The wafer of phase 1 does not need to be made using Smart Cut® technology, although Smart Cut® technology constitutes an appropriate process choice. For example, it can also be obtained by the BESOI™ technology. It may be noted here that in the preferred embodiment shown here, the first wafer is SOI only for convenience. It would in principle be possible to use a standard silicon bulk wafer as the initial wafer of phase 1, such a wafer being, implanted with hydrogen ions, bonded to the GeOI wafer made in phase 2, whereupon Smart Cut® splitting technology could be used to transfer a thin silicon layer from the bulk wafer to the GeOI wafer.

According to the first step S1 in FIG. 1, a silicon (Si) donor substrate (1) is oxidized to form an oxide layer (5a) and subjected to implantation of ions such as $H^+$ or $He^+$ in order to generate a zone of weakness (4) at a controlled depth. Single crystal Si substrates having an (industry-standardized) diameter of 200 mm or 300 mm will typically be used. The thickness of the silicon film in the SOI wafer should be compatible with the waveguide properties. An appropriate range of thickness will be from 200 nm to 1.5 microns. A common thickness will be about 500 nm. Normal implant parameters that are used in making Unibond® wafers of the specified thickness may be employed, typically $5\times10^{16}$ $H^+/cm^2$ implanted at energies that range from 30 to 200 keV, depending on the desired final thickness. The silicon oxide layer (5a) will have a thickness appropriately chosen for example in the range of 50 to 500 nm. In this example, a silicon oxide layer is formed but more generally it is an insulating layer, which can appropriately be either a silicon oxide layer or a silicon nitride. The thickness of this insulating layer, typically an oxide layer, is of little importance in the present invention, as it is used primarily as an etch stop in removing the substrate after bonding to GeOI.

The zone of weakness is created between, on the one hand, a region (it) of the Si donor substrate (1) which is adjacent to the oxide layer (5a) and, on the other hand, a region (1r) of the Si donor substrate (1) which is exposed on the back side (3). Region (1t) is destined to be transferred for preparation of a multilayer structure according to the present invention, whereas region (1r) is the residual part of the substrate which will not become part of the multilayer structure being prepared but may in practice be reusable (via further ion implantation).

In a second step S2, the Si donor substrate with a zone of weakness prepared in step S1 is bonded to a handle substrate consisting of a support layer of silicon (6) with a surface (insulating) "oxide" layer (5b), the front face (2) being bonded through the insulating (silicon dioxide) layer (5b) to the support layer of silicon (6), the insulating layers (silicon dioxide layers) (5a) and (5b) here being coalesced into a single insulating (silicon dioxide) layer (5). The silicon base handle substrate will appropriately have a thickness of about 725 μm for a wafer diameter of 200 mm and 775 μm for a wafer diameter of 300 mm. The $SiO_2$ layer on the base wafer (5b) will typically be very thin, between 1 to 20 nm, the main thickness of $SiO_2$ being on the donor wafer. Since the silicon layer (6) has only a support rather than an electronic and/or optical role in the final product, this layer does not have to have the same quality as is required of the front face of the donor substrate (1). The donor and handle substrates before bonding can be subjected to a cleaning step for example with a RCA treatment consisting in a cleaning with a first solution of ammonium hydroxide ($NH_4OH$), hydrogen peroxide ($H_2O_2$) and deionised water followed by the application of a second solution containing hydrochloric acid (HCl), hydrogen peroxide ($H_2O_2$) and deionised water. Optionally the surfaces to be bonded can be subjected to plasma treatment containing for example oxygen, nitrogen and/or argon. After bonding, a thermal treatment can be applied to reinforce the bonding.

In a third step S3, splitting of the initial Si donor substrate (1) along the predetermined plane of weakness (4) is carried out using thermal energy (such as by heat treatment in a furnace) and/or mechanical energy (for example, using a blade). The transferred part (1t) of the initial Si donor substrate remains bonded to the support layer 6 via the insulating ($SiO_2$) layer (5), whereas the remainder (1r) of the initial Si donor substrate is detached.

In a fourth step S4, the transferred part (1t) of the initial Si donor substrate is subjected to a treatment to form a new insulating layer (for example a surface oxidation or nitration step). Oxidation of the surface may for example be achieved by thermal treatment in an oxidizing atmosphere, which may comprise dry oxygen or steam. In this case, the layer (it) is converted into an underlying silicon layer (7) and a surface silicon dioxide layer (8). The oxide layer can also be formed by chemical vapour-phase deposition (CVD) at low pressure or plasma-assisted. Another example of a CVD oxide is a TEOS (tetra-ethyl-ortho-silicate) oxide that can be deposited at 650 to 850° C. to a suitable thickness, such as 500 to 3000 nm and later densified by subjecting it to a temperature of the order of 1000° C. Namely, deposition can be carried out using the Low Pressure Chemical Vapor Deposition (LPCVD) technique, for example at low temperature and under an atmosphere containing the TEOS (tetraethylorthosilicate $Si(OC_2H_5)_4$) precursor, or at high temperature (High Temperature Oxide, HTO) under an atmosphere containing silane and oxygen. This type of deposition could also be carried out using the Plasma Enhanced Chemical Vapor Deposition (PECVD) technique, which can be used at a lower temperature than the LPCVD technique. The final thickness of the silicon layer (layer (7) in FIG. 3) may appropriately be chosen around 500 nm, but may range from 200 to 1500 nm. The final thickness of the oxide (layer 8) between Si layer 7 and Ge may appropriately be chosen about 1000 nm, but depending on the specific design could range from 500 nm to 3000 nm.

This latter step S4 completes the first phase of this embodiment of the method of the present invention, relating to the preparation of a surface-oxidized SOI (silicon-on-insulator) substrate.

The second phase of this illustrative process embodiment, which need not follow in time the first phase, is represented schematically by FIG. 2.

In a manner analogous to that used to prepare the SOI substrate in FIG. 1, in a first step a germanium (Ge) donor substrate (21) with the surface plane that is preferably not the typical (100) crystallographic plane, but is instead tilted by about 6 degrees away from the (100) towards a (111) plane, is subjected to implantation of atomic/ionic species such as H$^+$ and/or He in order to generate a zone of weakness (24) at a controlled depth (step G1).

In a second step G2, the Ge substrate with a zone of weakness prepared in step G1 is bonded to the (oxidized) surface layer having the insulating layer of a handle substrate consisting of a support layer of silicon (28) with an insulating (oxidized) (silicon dioxide) layer (27) on one surface thereof. The Si base here will appropriately have a standard silicon wafer thickness, which depends on wafer diameter: typical values are 725 μm for 200 mm wafer diameter, or 775 μm for 300 mm wafer diameter, less for 100 and 150 mm wafers. Typical thicknesses for the SiO$_2$ surface layer in this handle substrate will be appropriately around 200 nm of the total SiO$_2$ thickness between Si and Ge. Since it is easier to grow thermal oxide on Si than forming one on Ge, in most practical applications, most of the oxide will be on the Si wafer. Depending on a specific application, this oxide may be useful for electrical isolation between the Ge layer and the handle substrate or in some other cases the devices would work equally well or maybe better without any oxide under the Ge. Therefore the thickness is a tradeoff determined by the ease of bonding, need for a minimum electrical isolation, and a contrasting need for excess heat dissipation into the substrate.

In a third step G3, splitting of the initial Ge donor substrate along the predetermined plane of weakness (4) is carried out using thermal energy and/or mechanical energy, such that only part (25) of the Ge substrate remains attached to the a support layer of silicon (28) via the silicon dioxide layer (27).

This latter step G3 completes the second phase of this embodiment of the method of the present invention, relating to the preparation of a GeOI (germanium-on-insulator) substrate.

Disclosures illustrating Smart Cut® technology, implantation regimes and bonding conditions etc., well known to those skilled in the art, can be found in U.S. Pat. No. 7,256,075, U.S. Pat. No. 7,229,898, U.S. Pat. No. 7,282,449, U.S. Pat. No. 7,232,743 and U.S. Pat. No. 7,285,471.

There are other ways of preparing a germanium layer on a silicon handle substrate. Instead of a homogeneous germanium donor substrate (21) shown in FIG. 2A, a heterogenous substrate can be used that consists of a layer of germanium grown epitaxially on a silicon substrate. Such a choice for the starting germanium film is motivated by two factors. First, larger diameter, 200 mm and 300 mm, germanium wafers are in very short supply, and where available they are very expensive. Epitaxial growth allows forming germanium films that extend across the entire surface of silicon wafers, regardless of silicon wafer diameter. Second, because of the difference in the thermal expansion coefficients between silicon and germanium, bonding of large diameter silicon wafer to the same diameter homogeneous germanium wafer leads to extreme stresses that often cause breakage of the bonded wafer couple. If only a small fraction of the thickness of a germanium-donor wafer consists of germanium, the rest being silicon, such donor wafer has thermal expansion properties similar to those of pure silicon wafer and the bonding operation is routine.

The growth of high quality epitaxial germanium films on silicon is not simple. Since there is about 4.2% mismatch in the atomic lattice spacing between these two materials, crystallographic defects form during germanium growth on silicon, primarily linear defects known as misfit dislocations. These dislocations lie in the plane of the wafer but their ends often bend towards the free surface, becoming threading dislocations. The number of such dislocations needs to be kept in check if the final germanium layer is to be a good template for forming light emitters and detectors on top.

There are many strategies to deal with growth of low-defectivity germanium on top of silicon. One approach is to deposit a thin germanium nucleation layer on silicon at a low temperature, about 400 to 450° C., followed by growth of the main body of the germanium film at a higher temperature. Another approach, known as a buffer layer method, is to ramp slowly the concentration of germanium in an alloy film, starting with close to 0% of germanium and increasing the concentration gradually to a value that could be 50 or 70 or even 100% Ge. The misfit dislocation will be primarily confined in the buffer layer, so that the pure germanium film that is grown on top of the buffer has a much lower concentration of crystallographic defects. As mentioned above in reference to the case of bulk germanium, it is advantageous to have germanium films that are slightly tilted away from the (100) plane towards the (111) plane. Such tilt, ideally by about 6 degrees, facilitates heteroepitaxial growth of GaAs on Ge. To achieve this tilt in epitaxial Ge layers grown on silicon, the starting silicon handle substrates should appropriately be cut at this slight angle to the (100) plane.

More generally, considering manufacturing methods beyond the specific one illustrated in FIGS. 1-2, providing structures which are assembled and then further transformed as shown in an illustrative manner in FIGS. 3-4, multilayer wafer structures according to the present invention will generally comprise a bonding interface somewhere inside the oxide layer that separates the upper silicon layer (in which optical waveguides are made) and the lower germanium or III-V layer. Therefore in fabrication of the final device structure that is a subject of the present invention, two wafers are expected in practice always generally to be used in the beginning. These are the silicon wafer (wafer 1) which will become the upper silicon layer (7) containing a waveguide, and wafer 2, which will provide the layer (25) that is lattice compatible with III-V compounds, and may typically comprise Ge. Each of these two wafers can be made by a variety of methods.

The upper wafer (wafer 1) is needed to provide a silicon layer of a reasonably uniform thickness, of the order of 200 nm to 1.5 micrometers. Such a film can be made by several methods:

1. Start with an SOI wafer as wafer 1, bond to wafer 2 (making sure that there is a suitable oxide in between) and remove the handle wafer by grinding and etching, and possibly what was the buried oxide (BOX) in wafer 1. The process is simple, but a SOI wafer is sacrificed and the handle wafer is destroyed in the process and so cannot be reused.
2. Start with a bulk silicon wafer as the wafer 1, oxidize it, implant it with hydrogen, bond to wafer 2 and split off the majority of the wafer 1. This is the conventional Smart Cut® technology, but applied in a case where the wafer 2 is itself a complicated structure and not just a bulk Si wafer. Such a method is expected to cost less than the one described in point 1.
3. Less likely at present, because of the lack of commercial availability, are the following options:
   a. Use as the wafer 1 a precursor wafer of the ELTRAN process—epitaxial silicon layer grown on a weak zone made from porous silicon that is sealed on the surface with hydrogen anneal. This is in effect the ELTRAN process applied to an unconventional handle wafer.
   b. Use bulk silicon as the wafer 1 and grind it down to a suitable thickness—the approach used in bond and etch back SOI (BESOI) that predates Smart Smart Cut® technology. The main problem here is the difficulty of getting good thickness control.

The lower wafer (wafer 2) can also be made by several methods:
4. Fabricate a GeOI wafer as described before.
5. Fabricate a GeOI like structure, but without oxide between germanium and the silicon handle. Since SOI with a zero thickness of oxide has been demonstrated, it is expected to be possible to make such structures with germanium as well.
6. As mentioned above, it is possible to make a germanium-on-silicon structure by epitaxial growth, e.g. heteroepitaxy of germanium on silicon by chemical vapor deposition (CVD), well known to those skilled in the art. Processes for growing Ge directly on Si have been reported, for example, in "Reduced pressure—chemical vapor deposition of Ge thick layers on Si(001) for 1.3-1.55-mu m photodetection", J. M. Hartmann, A. Abbadie, A. M. Papon, P. Holliger, G. Rolland, T. Billon, J. M. Fedeli, M. Rouviere, L. Vivien, and S. Laval, J. Appl. Phys. 95, 5905 (2004); "Germanium-rich silicon-germanium films epitaxially grown by ultrahigh vacuum chemical-vapor deposition directly on silicon substrates", Douglas D. Cannon et al., Appl. Phys. Lett. 91, 252111 (2007); "Reduced-Pressure Chemical Vapor Deposition of Epitaxial Ge Films on Si(001) Substrates Using $GeCl_4$", Electrochem. Solid-State Lett., Volume 10, Issue 11, pp. H313-H316 (2007), J. Park, M. Curtin, C. Major, S. Bengston, M. Carroll, A. Lochtefeld. There are many approaches and subtle variations, and none provide a perfect defect-free germanium crystal. In the framework of the present invention, absolute perfection is not required. The two main methods are a) very thin nucleation layer grown at a low temperature (temp.1), followed by the main film growth at a higher temperature (temp.2); b) a buffer layer of silicon germanium compound is grown on silicon, in which germanium concentration gradually rises. This buffer layer tends to contain misfit dislocations so that not many penetrate the top region where there is either pure germanium or a very high proportion of germanium. This substrate, grown by the method (a) or (b) becomes the handle for the final electronic/photonic circuit.
7. Take the substrate as described in point 6, and transfer the top germanium layer to a new silicon substrate, with some oxide in-between. This is GeOI, as described in point 4, but now the donor wafer is a composite of germanium and silicon.
8. Use a material different than germanium. InP is one possibility, GaAs is another. InP-on-insulator obtained with Smart Cut® technology was demonstrated, and GaAs-on-insulator also. GaAs can be grown directly on Si. There are many defects, but this may be acceptable in the framework of the present invention. Then there are a variety of ternary compounds (example: InGaAs) and quarternary compounds (InGaAsP) of these elements and some of them can be grown directly on silicon (again with defects). Such wafers could be used as the handle for the final electronic/photonic circuit.

Coming back to the particular illustration of an embodiment of the present invention as shown in FIGS. 1 to 4, in the third phase of this illustrative process embodiment providing one method for preparing multilayer wafer structures according to the present invention, following on from the illustrative processes described in FIGS. 1 and 2, is illustrated schematically by FIG. 3.

Figure 2A:
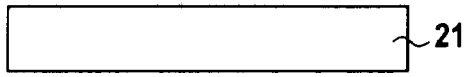
FIG. 2 shows in a schematic and illustrative manner one possible manufacturing stage in the preparation of a multilayer structure according to the present invention, this manufacturing stage consisting in the preparation of a surface-oxidized GeOI (germanium-on-insulator) substrate using Smart Cut® technology.
Figure 2B:
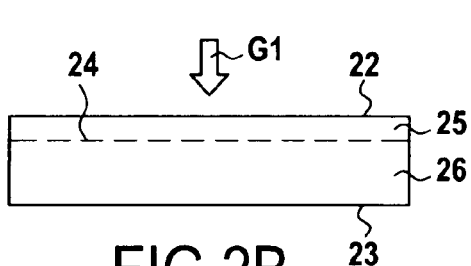
Figure 2C:
Figure 2D:
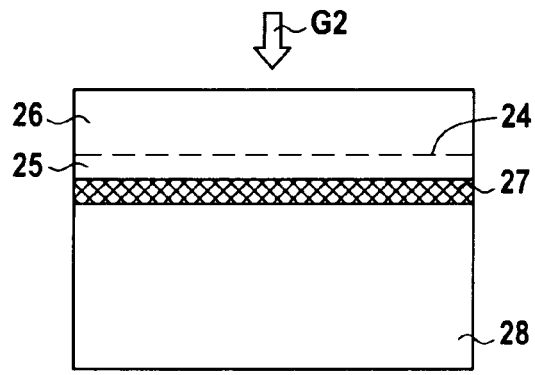
Figure 2E:
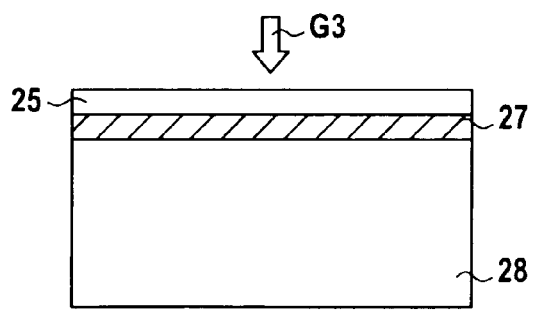

In the first part A1 of this assembly phase, as shown in FIG. 3A, the surface silicon dioxide (insulating) layer (8) of the surface-oxidized SOI substrate produced as described in FIG. 1 (see FIG. 1F) is bonded to the germanium layer (25) of the GeOI substrate produced as described in FIG. 2 (see FIG. 2E). Typical bonding conditions here will be similar to those described in second step G2.

In the following step A2 shown in FIG. 3B, the silicon layer (6), which was the supporting layer in the handle substrate (cf. FIG. 1C) is removed by wafer grinding, by chemical-mechanical polishing (CMP) and/or by chemical etching. In subsequent step A3, the silicon dioxide layer (5) originating from the handle substrate is also removed.

This third phase of the process leads to a heterostructure of functional Si layer (7) upon oxide layer (8), a so-called buried oxide (BOX) layer, upon Ge layer (25), upon a further oxide layer (27) upon a supporting Si layer (28). The supporting Si layer (28) has a structural role, whereas it is the surface Si layer (7) that will contain electronic circuits.

The insulating layer (8), here an oxide layer, between the germanium film (25) and the silicon film (7) that is above it, is essential for forming optical waveguides in the latter. The second oxide layer (27), below germanium layer (25), is sometimes convenient for additional electrical insulation of various devices, but is not essential. Therefore, one option for fabrication of a wafer in phase 2 is to use a germanium-silicon hybrid wafer (grown with or without a buffer layer) directly, as opposed to using a Ge-on-insulator wafer. Another alternative is to use directly a III-V material instead of germanium. A layer transfer of InP (indium phosphide) by the Smart Cut™ technology to a silicon wafer with an intervening silicon dioxide can be realized. A GaAs layer can also be transferred on oxide on a silicon wafer that was produced by Smart Cut. GaAs has been also grown directly on silicon, although it tends to be highly defective, more so than in the case of germanium grown on silicon. If material other than germanium is used, processing temperatures and other process parameters need to be modified based on the known properties of these materials (InP, GaAs, other III-V binary, ternary, or quaternary compounds).

In order to incorporate electronic circuits and waveguides in the silicon layer (7) in the final product, an appropriate time in the overall process would be at this stage (not shown in attached FIGS. 1-4) before preparation of photodetector zone(s) (61) and light source zone(s) (62) in the phase shown in FIG. 4. The top Si layer may be processed to contain waveguides, that guide light from one point to another, optical devices that are made out of properly shaped waveguides, such as ring resonators, arrayed waveguide gratings (AWGs) that can be used as multiplexers/demultiplexers for systems that handle multiple light wavelengths, etc. The same silicon film may appropriately contain conventional transistor-based electronic circuits that process signals before they are converted to optical signals, for example in light modulators. Similarly, after light pulses are detected, they are shaped and further processed in transimpedance amplifiers, known as TIAs. Conventional electronic digital or analog circuits can also exist in the silicon film. All such devices may be fabricated by conventional silicon processing techniques. In effect, III-V compounds risk contaminating and damaging the silicon device fabrication process. When incorporating electronic circuits and waveguides at this point in silicon layer (7), care must be taken not to exceed the melting temperature of germanium (about 950° C.) that is encapsulated below.

In such manufacturing steps for the incorporation of electronic circuits, not shown in FIG. 4, electronic circuits can be incorporated into the silicon layer (7) by conventional processes that include ion implantation, rapid thermal annealing, oxidation, wet cleaning, lithography, reactive ion etching, metallization, etc., as described in textbooks of semiconductor processing, for example: Handbook of Semiconductor manufacturing Technology, Second Edition, edited by Robert Doering and Yoshio Nishi, CRC Press (Boca Raton, London, New York 2007) and references therein.

In a fourth phase of the process according to an embodiment of the present invention is illustrated schematically by FIG. 4.

Overall, in the illustrative embodiment of FIG. 4, in at least two distinct regions, the surface silicon layer (7) and the underlying BOX layer (8) are etched away to produce cavities (41) and (42) and expose underlying germanium in layer (25). With regard to the densities of photoemitter and photodetector sites on the wafer surface, there could be just a few emitters and detectors per chip or as many as a few hundred. Conventional plasma or reactive ion etching may be used to etch through the top silicon layer and through the oxide below it. It is important to try to avoide inducing much damage in the germanium surface or removing such damage afterwards, since homoepitaxy or heteroepitaxy on germanium requires a good crystalline template. The targeting of specific regions will typically be achieved using a photolithographic process in which a mask is used to ensure selective exposure of only certain surface regions to etching processes.

Concerning the order of the steps involved in producing cavities (41) and (42) and filling them in to produce, respectively, photodetector zone (61) and light source zone (62), respectively, different manufacturing orders are possible.

In a preferred embodiment, Ge is grown first in the cavity designed for a photodetector, then encapsulated with deposited film of oxide. After this one may etch the second type of cavity (42) and grow III-V material (in light source zone (62) in FIG. 4E). Since it is difficult to achieve selective deposition just in the cavities, the excess material will generally need in practice to be removed from the wafer surface before the second type of material is grown. This also means that there has to be a sacrificial barrier layer on the surface before a cavity is etched and deposition started. This will most likely be a deposited oxide or nitride film. If both emitter and detector are made of III-V, they might be grown together or not, depending on whether the light emitter and detector layer have the same composition.

In a preferred embodiment, the at least one cavity (41) is filled with germanium in a homoepitaxial growth process on that part of the germanium layer (25) which is located at the bottom of the cavity (41). The exposed part of the germanium layer (25) thus acts as a template for homoepitaxial growth of germanium region (61), which can be made into a photodetector by adding suitable doping and metallization. In another sub-step, at least one cavity (42) is filled with a III-V material in an epitaxial growth process on the part of the germanium layer (25) at the bottom of the cavity (42). The exposed part of the germanium layer (25) thus also acts as a template for epitaxial growth of a III-V region (62), in which a light source can be formed by conventional doping, epitaxy, lithography and metallization steps.

Figure 4A:
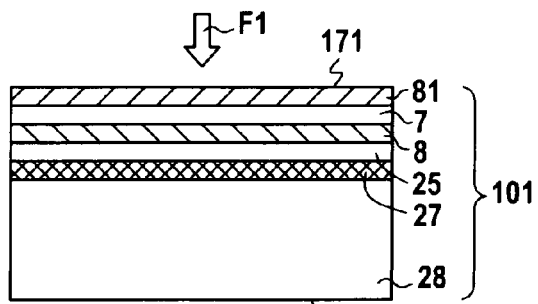
FIG. 4 shows in a schematic and illustrative manner an example manufacturing process involving removal of the outer Si and BOX (meaning "Buried Oxide") layers in selected regions to expose Ge, and growth of at least one Ge photodetector on at least one thus exposed Ge site and growth of at least one photoemitting structure made of III-V material on at least one other thus exposed Ge site.
Figure 4B:
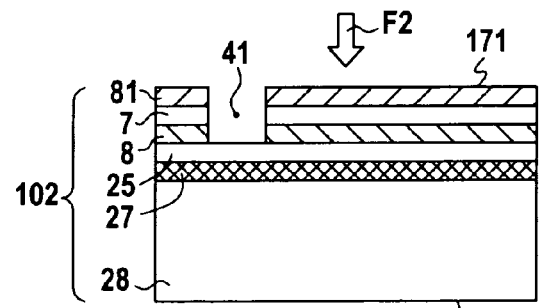
Figure 4C:
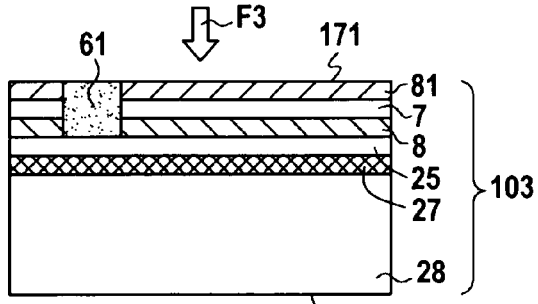
Figure 4D:
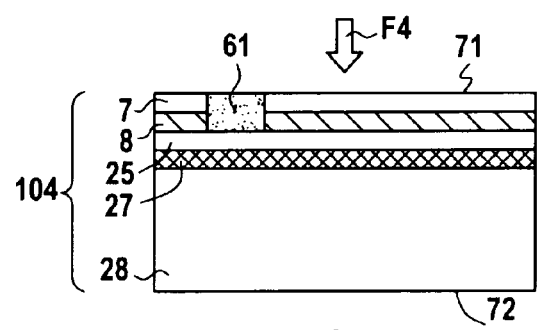
Figure 4E:
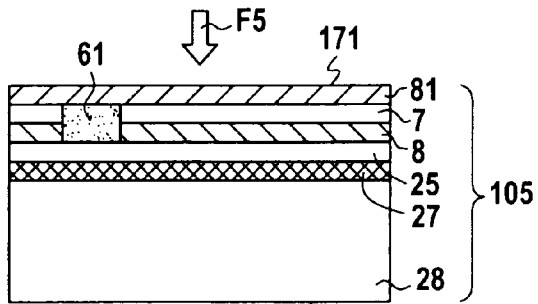
Figure 4F:
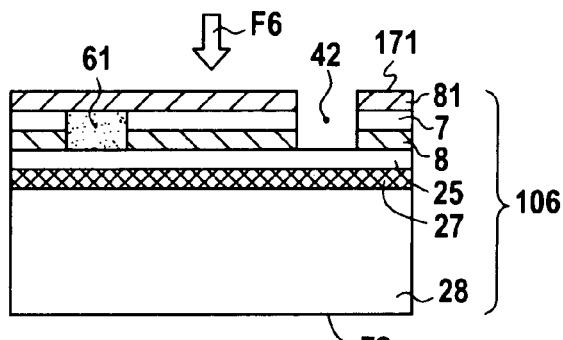
Figure 4G:
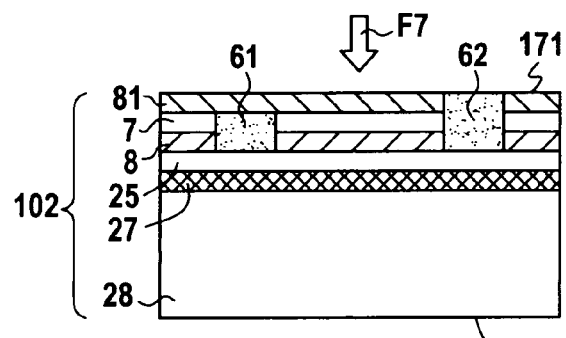
Figure 4H:
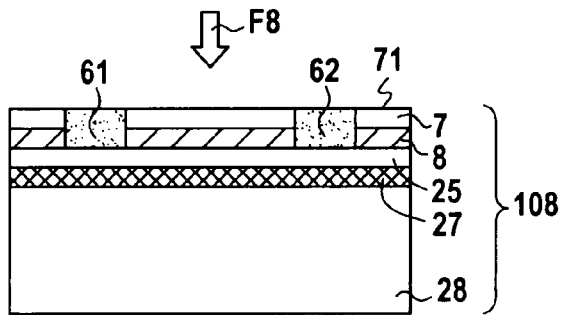
Figure 4I:
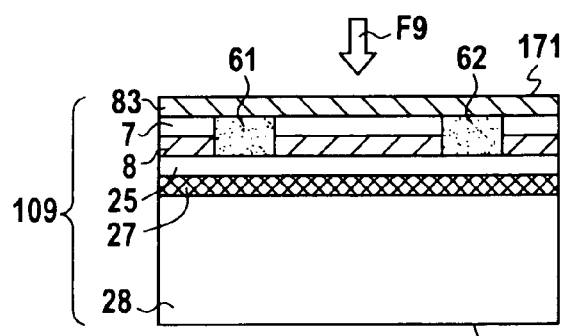

Typically, the wafer will be coated first with a protective sacrificial and masking layer, for example by depositing by CVD a film of $SiO_2$ or $SiO_2$/SiN multilayer shown as layer (81) in FIG. 4A. Then cavities for the growth of Ge-based photodetectors will be formed by lithographic and etching techniques known in the art (step F2, giving rise to the structure of FIG. 4B with cavity (41)). The cavity (41) (or cavities) may then be filled with the required structures (step F3, giving rise to the structure of FIG. 4C). As the next step the excess germanium may be removed from the surface, and the protective sacrificial layer as well (step F4, giving rise to the structure of FIG. 4D). Another sacrificial and masking layer may be deposited as before, which would now play the additional function of encapsulating the germanium detectors (step F5, giving rise to the structure of FIG. 4E). The process sequence would be repeated to form the second type of cavity and grow III-V material (steps F6 and F7). Excess III-V material and the sacrificial film may then be removed (step F8). A layer (83) of $SiO_2$ might be added to provide waveguide cladding on the top (step F9). The finishing steps would include the conventional processes to define contact windows one or many layers of metalization consistent with the requirements of the electronic components.

In the case where both emitter and detector are made of III-V, they might be grown together or not, depending on whether the light emitter and detector layer have the same composition.

Concerning the structure of the light detector and emitter regions in the light detector and emitter zones, the regions may have multiple layers and features and thus be considered as devices and not just mere doped regions. A typical size may be from a few tens of nanometers to, in some cases, a few microns. A detector is typically a reverse-biased diode with three regions: p, i, and n. A conventional diode is just p and n, but in a detector an intrinsic (undoped) region is usually added between p and n. Light absorption produces electron hole pairs within the i region and the electrical field of a reverse-biased diode sweeps electrons in one direction and the holes in the opposite direction, thus producing current. For the infrared light that can propagate in a silicon waveguide, germanium is an appropriate material for detectors, since it absorbs in the right wavelength range, and some III-V materials can also be used. Semiconductor lasers and LEDs are basically forward-biased diodes, where the reverse process takes place: electrons and holes recombine at a junction to produce photons. III-V materials are appropriate for light source regions, such as, for example, InP-based structures.

Figure 5:
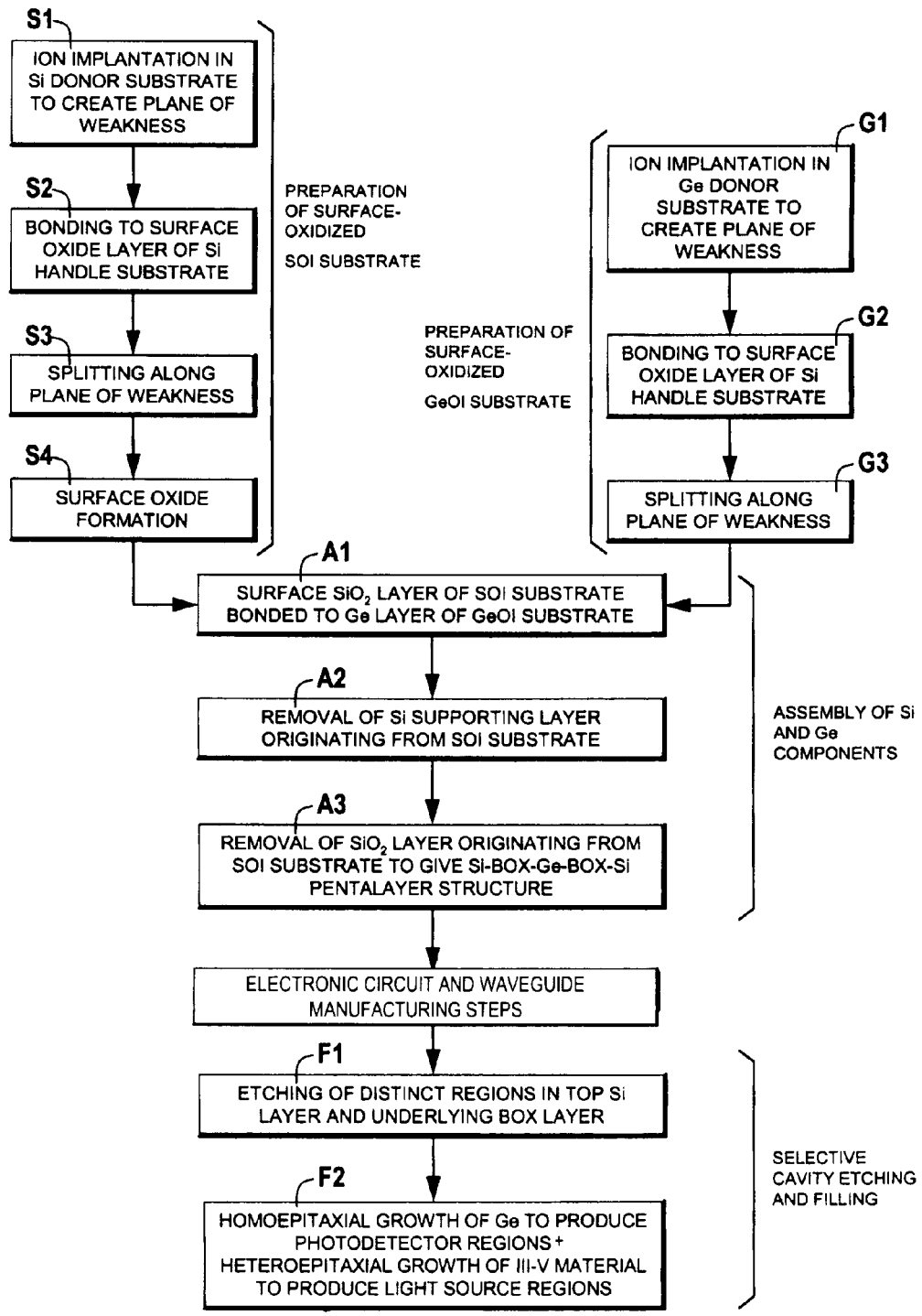
FIG. 5 provides a schematic representation of an overall sequence of the illustrative manufacturing steps set out in FIGS. 1 to 4.
Figure 6A:
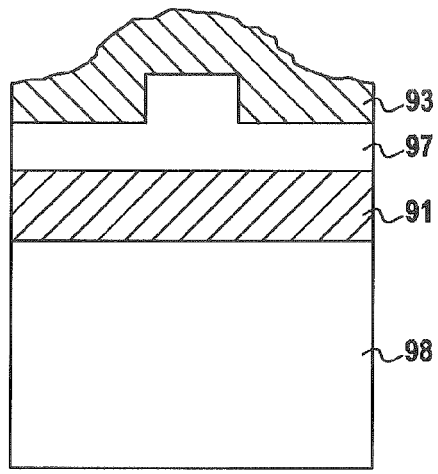
FIG. 6 illustrates schematically two types of silicon waveguides, often called wire (or strip) waveguides and rib (or ridge) waveguides, that can be used in the functional upper silicon layer (7) of multilayer wafer structures according to the present invention.
Figure 6B:
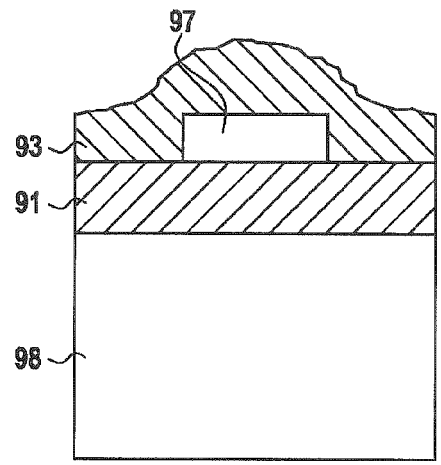
Figure 7A:
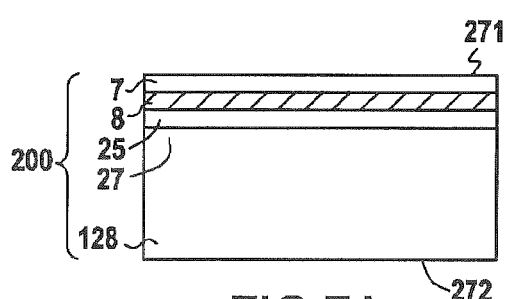
FIGS. 7A and 7B show schematically a generalized support layer (128), which may be oxide on silicon, or silicon itself upon which layer (25) rests directly, or another type of support.
Figure 7B:
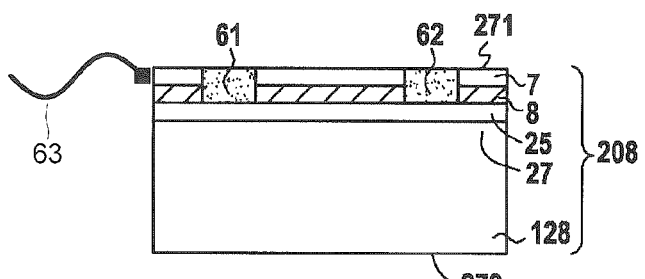

The overall sequence of manufacturing steps in the illustrative embodiment of FIGS. 1-4 is shown schematically in FIG. 5.

What is claimed is:

1. A multilayer wafer structure comprising:
    a silicon layer, an insulating layer and a layer that is lattice compatible with Group III-V compounds, with the lattice compatible layer in contact with one face of the insulating layer, and the silicon layer in contact with the face of the insulating layer opposite the lattice compatible layer,
    wherein the silicon and insulating layers contain at least one continuous cavity linking the lattice compatible layer to an exposed surface of the multilayer wafer structure, with the cavity filled with one of (1) materials compatible for fabricating a light detector and having a photodetector region therein, thus constituting a photodetector zone, or (2) a Group III-V material and a light source region therein, thus constituting a light source zone;

wherein the silicon layer contains at least one waveguide connecting (1) the photodetector zone with a light source that is either within the multilayer wafer structure or is connected to it by an optical fiber, or (2) the light source zone with a photodetector that is either within the multilayer wafer structure or is outside it and connected to it by an optical fiber, and wherein the lattice compatible layer is supported on an oxide layer, itself supported by a silicon base substrate so as to constitute a Si-BOX-Ge-BOX-Si pentalayer structure.

2. A multilayer wafer structure comprising:

a silicon layer, an insulating layer and a layer that is lattice compatible with Group III-V compounds, with the lattice compatible layer in contact with one face of the insulating layer, and the silicon layer in contact with the face of the insulating layer opposite the lattice compatible layer, wherein the silicon and insulating layers contain at least one continuous cavity linking the lattice compatible layer to an exposed surface of the multilayer wafer structure, with the cavity filled with one of (1) materials compatible for fabricating a light detector and having a photodetector region therein, thus constituting a photodetector zone, or (2) a Group III-V material and a light source region therein, thus constituting a light source zone;

wherein the silicon layer contains at least one waveguide connecting (1) the photodetector zone with a light source that is either within the multilayer wafer structure or is connected to it by an optical fiber, or (2) the light source zone with a photodetector that is either within the multilayer wafer structure or is outside it and connected to it by an optical fiber, and wherein the silicon layer is a surface layer that contains electronic circuit elements.

3. A method of manufacturing a multilayer wafer structure which comprises:

providing a multilayer wafer structure that includes a silicon layer containing at least one waveguide, an insulating layer and a layer that is lattice compatible with Group III-V compounds, with the lattice compatible layer in contact with one face of the insulating layer, and the silicon layer in contact with the face of the insulating layer opposite the lattice compatible layer;

coating the silicon layer with a protective sacrificial and masking layer;

carrying out lithography and etching to produce a first cavity extending from the lattice compatible layer through the insulating layer, and through the silicon layer provided with the protective and masking layer; and filling the cavity with (1) materials compatible for fabricating a light detector and forming a photodetector region therein, thus constituting a photodetector zone, or (2) a Group III-V material and forming a light source region therein, thus constituting a light source zone.

4. The method of claim 3 wherein the cavity is filled with the Group III-V material and a light source region therein, thus constituting a light source zone.

5. The method of claim 3 wherein the cavity is filled with materials compatible for fabricating a light detector and forming a photodetector region therein, thus constituting a photodetector zone.

6. The method of claim 4 which further comprises:

after filling the cavity, removing excess filling material and the previously deposited residual protective sacrificial and masking layer from the silicon layer;

coating the silicon layer once more with a further protective sacrificial and masking layer;

carrying out lithography and etching once more to produce a second cavity extending from the silicon surface through the insulating layer, and into the lattice compatible layer;

filling the second cavity with materials compatible for fabricating a light detector and forming a photodetector region therein, thus constituting a photodetector zone; and removing excess filling material and the previously deposited residual protective sacrificial and masking layer from the silicon layer to form the multilayer wafer structure as a product.

7. The method of claim 5 which further comprises:

after filling the cavity, removing excess filling material and the previously deposited residual protective sacrificial and masking layer from the silicon layer;

coating the silicon layer once more with a further protective sacrificial and masking layer;

carrying out lithography and etching once more to produce a second cavity extending from the silicon layer through the insulating layer, and into the lattice compatible layer;

filling the second cavity with a Group III-V material and forming a light source region therein, thus constituting a light source zone; and removing excess filling material and the previously deposited residual protective sacrificial and masking layer from the silicon layer to form the multilayer wafer structure as a product.

8. The method of claim 7, which further comprises coating the silicon layer of the product with silicon dioxide.

9. The method of claim 8, which further comprises providing the multilayer wafer structure in the form of a Si-BOX-Ge-BOX-Si pentalayer structure comprising a central germanium layer sandwiched between two silicon dioxide layers, with one silicon dioxide layer being sandwiched between a germanium layer and a surface silicon layer and the other silicon dioxide layer being sandwiched between the germanium layer and a support silicon layer.

10. The method of claim 9, wherein the Si-BOX-Ge-BOX-Si pentalayer structure is provided by:

providing a silicon-on-insulator (SOI) structure comprising a surface silicon dioxide layer and an inner silicon dioxide layer, between which is sandwiched a silicon layer, with the silicon dioxide layer face opposite the silicon layer being a silicon support layer;

providing a germanium-on-insulator structure (GeOI) comprising a silicon dioxide layer sandwiched between a silicon support layer and a germanium layer;

bonding the silicon dioxide layer of the SOI structure to the germanium layer of the GeOI structure to form an assembled SOI-GeOI structure;

removing the silicon support layer from the assembled SOI-GeOI structure; and removing the silicon dioxide layer from the assembled SOI-GeOI structure.

* * * * *